US 12,382,754 B2

(12) United States Patent
Tangring et al.

(10) Patent No.: US 12,382,754 B2
(45) Date of Patent: Aug. 5, 2025

(54) OPTOELECTRONIC SEMICONDUCTOR DEVICE COMPRISING AN INSULATING LAYER AND METHOD OF MANUFACTURING THE OPTOELECTRONIC SEMICONDUCTOR DEVICE

(71) Applicant: OSRAM Opto Semiconductors GmbH, Regensburg (DE)

(72) Inventors: Ivar Tangring, Regensburg (DE); Michael Huber, Bad Abbach (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 696 days.

(21) Appl. No.: 17/440,190

(22) PCT Filed: Mar. 16, 2020

(86) PCT No.: PCT/EP2020/057033
§ 371 (c)(1),
(2) Date: Sep. 17, 2021

(87) PCT Pub. No.: WO2020/187815
PCT Pub. Date: Sep. 24, 2020

(65) Prior Publication Data
US 2022/0158034 A1    May 19, 2022

(30) Foreign Application Priority Data
Mar. 19, 2019    (DE) .............. 10 2019 106 938

(51) Int. Cl.
*H10H 20/83* (2025.01)
*H10H 20/01* (2025.01)
(Continued)

(52) U.S. Cl.
CPC .......... *H10H 20/831* (2025.01); *H10H 20/01* (2025.01); *H10H 20/82* (2025.01);
(Continued)

(58) Field of Classification Search
CPC ..... H01L 33/382; H01L 33/387; H01L 33/64; H01L 23/42; H01L 33/644; H01L 33/641; H01L 33/642; H01L 33/44
See application file for complete search history.

(56) References Cited

U.S. PATENT DOCUMENTS

2009/0283787 A1    11/2009 Donofrio et al.
2013/0134867 A1    5/2013 Yang et al.
(Continued)

FOREIGN PATENT DOCUMENTS

DE    102012217533 A1    3/2014
DE    102015100578 A1    7/2016
(Continued)

OTHER PUBLICATIONS

International search report issued for the corresponding international patent application No. PCT/EP2020/057033, dated Jun. 5, 2020, 5 pages (for informational purposes only).
(Continued)

*Primary Examiner* — Joshua Benitez Rosario
*Assistant Examiner* — Moataz Khalifa
(74) *Attorney, Agent, or Firm* — VIERING, JENTSCHURA & PARTNER mbB

(57) ABSTRACT

An optoelectronic semiconductor device may include a first and a second semiconductor layer having a first and a second conductivity type. The optoelectronic semiconductor device may include a first contact layer in direct contact with the first semiconductor layer, a first insulating layer formed over the semiconductor layers, and a second current spreading structure electrically connected to the second semiconductor (Continued)

layer. A maximum lateral extension of the second semiconductor layer is greater than a maximum lateral extension of the first semiconductor layer, such that a step structure is formed, and the first insulating layer is formed as a conformal layer over the step structure. A second insulating layer may be arranged between a horizontal surface of the first contact layer and the second current spreading structure. The thickness of the second insulating layer is smaller than the smallest thickness of the first insulating layer over the step structure.

22 Claims, 10 Drawing Sheets

(51) Int. Cl.
  *H10H 20/82* (2025.01)
  *H10H 20/831* (2025.01)
  *H10H 20/84* (2025.01)
(52) U.S. Cl.
  CPC ........... *H10H 20/84* (2025.01); *H10H 20/032* (2025.01); *H10H 20/034* (2025.01)

(56) References Cited

U.S. PATENT DOCUMENTS

| | | |
|---|---|---|
| 2014/0209955 A1 | 1/2014 | Hopper et al. |
| 2015/0255685 A1 | 9/2015 | Herrmann et al. |
| 2018/0102460 A1 | 4/2018 | Kawaguchi et al. |
| 2018/0198047 A1 | 7/2018 | Danesh et al. |
| 2018/0248083 A1 | 8/2018 | Hoeppel et al. |
| 2018/0358512 A1 | 12/2018 | Hoeppel et al. |
| 2019/0140143 A1 | 5/2019 | Pfeuffer |
| 2020/0152113 A1 | 5/2020 | Hugon et al. |

FOREIGN PATENT DOCUMENTS

| | | | |
|---|---|---|---|
| DE | 102016111113 A1 | 12/2017 | |
| DE | 102016124380 A1 * | 6/2018 | |
| JP | 2012527116 A | 11/2012 | |
| JP | 2013533644 A | 8/2013 | |
| JP | 2014241401 A * | 12/2014 | ............ H01L 33/36 |
| WO | 2017060355 A1 | 4/2017 | |
| WO | 2017215910 A1 | 12/2017 | |
| WO | 2019016482 A1 | 1/2019 | |

OTHER PUBLICATIONS

German Search Report issued for the corresponding German patent application No. 10 2019 106 938.6, dated Dec. 4, 2019, 6 pages (only informational purposes only).

Japanese Search Report for the Japanese patent application No. 2021-556680, dated Sep. 8, 2022, 23 pages (for informational purposes only).

Chinese office action issued for the corresponding Chinese patent application No. 202080021800.5, dated Jul. 15, 2024, 4 pages (for the purpose of information only).

* cited by examiner

OPTOELECTRONIC SEMICONDUCTOR DEVICE COMPRISING AN INSULATING LAYER AND METHOD OF MANUFACTURING THE OPTOELECTRONIC SEMICONDUCTOR DEVICE

CROSS-REFERENCE TO RELATED APPLICATIONS

The present application is a national stage entry according to 35 U.S.C. § 371 of PCT Application No. PCT/EP2020/057033 filed on Mar. 16, 2020; which claims priority to German Patent Application Serial No. 10 2019 106.938.6 filed on Mar. 19, 2019; all of which are incorporated herein by reference in their entirety and for all purposes.

TECHNICAL FIELD

An optoelectronic semiconductor device having an insulating layer is specified. In addition, a method of manufacturing the optoelectronic semiconductor device is specified.

BACKGROUND

A light emitting diode (LED) is a light emitting device based on semiconductor materials. For example, an LED includes a pn junction. When electrons and holes recombine with one another in the region of the pn junction, due, for example, to a corresponding voltage being applied, electromagnetic radiation is generated.

A problem with the operation of LEDs is the generation of heat. In order to increase the efficiency of the LEDs, concepts are being sought which allow for the generated heat to be removed in an improved manner.

An objective is to provide an improved optoelectronic semiconductor device and an improved method of manufacturing an optoelectronic semiconductor device.

SUMMARY

An optoelectronic semiconductor device comprises a first semiconductor layer of a first conductivity type and a second semiconductor layer of a second conductivity type, the first and second semiconductor layer being stacked on top of each another to form a semiconductor layer stack. The optoelectronic semiconductor device further comprises a first contact layer, which is arranged in direct contact with the first semiconductor layer and which is electrically conductive, a first insulating layer, which is formed over the first and second semiconductor layers, and a second current spreading structure which is electrically connected to the second semiconductor layer. A maximum lateral extension of the second semiconductor layer is greater than the maximum lateral extension of the first semiconductor layer, so that a step structure is formed. The first insulating layer is formed as a conformal layer over the step structure of the first and second semiconductor layers. The optoelectronic semiconductor device also comprises a second insulating layer between a horizontal surface of the first contact layer and the second current spreading structure, wherein a layer thickness of the second insulating layer is smaller than the smallest layer thickness of the first insulating layer over the step structure.

According to embodiments, the optoelectronic semiconductor device further comprises a first current spreading layer which is arranged on a side of the first contact layer facing away from the first semiconductor layer and in direct contact with the first contact layer.

For example, the lateral extension of the current spreading layer is smaller than the lateral extension of the contact layer.

The current spreading layer may be directly adjacent to at least two side surfaces of the contact layer.

The optoelectronic semiconductor device further comprises a passivation layer which is directly adjacent to exposed regions of the steps structure. The passivation layer may be removed from a horizontal surface of the current spreading layer.

According to further embodiments, an optoelectronic semiconductor device comprises a first semiconductor layer of a first conductivity type and a second semiconductor layer of a second conductivity type, the first and second semiconductor layers being stacked on top of each another to form a semiconductor layer stack. The optoelectronic semiconductor device further comprises a first contact layer which is arranged in direct contact with the first semiconductor layer and is electrically conductive. The optoelectronic semiconductor device moreover comprises a passivation layer, a first insulating layer, which is formed over the first and second semiconductor layers, and a second current spreading structure, which is electrically connected to the second semiconductor layer. A lateral extension of the second semiconductor layer is greater than the lateral extension of the first semiconductor layer, so that a step structure is formed, and the passivation layer is formed as a conformal layer over a side surface of the contact layer. The optoelectronic semiconductor device further comprises a second insulating layer between a horizontal surface of the first contact layer and the second current spreading structure, wherein a layer thickness of the second insulating layer is smaller than the smallest layer thickness of the first insulating layer above the step structure.

According to embodiments, the optoelectronic semiconductor device further comprises a first current spreading layer which is arranged on a side of the first contact layer facing away from the first semiconductor layer and in direct contact with the first contact layer, wherein the first current spreading layer is directly adjacent to a side surface of the contact layer.

For example, the lateral extension of the current spreading layer is smaller than the lateral extension of the contact layer.

For example, the current spreading layer may be directly adjacent to at least two side surfaces of the contact layer.

According to embodiments, the passivation layer is removed from a horizontal surface of the current spreading layer.

For example, the layer thickness of the second insulating layer is less than half the smallest layer thickness of the first insulating layer over the step structure. According to further embodiments, the layer thickness of the second insulating layer is less than a third of the smallest layer thickness of the first insulating layer above the step structure.

For example, the second current spreading structure is arranged at least in portions on a side of the horizontal surface of the first contact layer facing away from the first semiconductor layer.

A method of manufacturing an optoelectronic semiconductor device comprises forming a layer stack comprising a first semiconductor layer of a first conductivity type and a second semiconductor layer of a second conductivity type, forming an electrically conductive first contact layer in direct contact with the first semiconductor layer, a maximum lateral extension of the second semiconductor layer being greater than the maximum lateral extension of the first semiconductor layer, so that a workpiece comprising a step structure is formed, and conformally forming a first insulating layer over the step structure of the first and second semiconductor layers. The method further comprises forming a second insulating layer over a horizontal surface of the first contact layer, a layer thickness of the second insulating layer being less than the smallest layer thickness of the first insulating layer over the step structure, and forming a second current spreading structure over the second insulating layer, the second contact structure being electrically connected to the second semiconductor layer.

The method may further comprise forming a first current spreading layer after forming the contact layer.

For example, the method may additionally include forming a sacrificial metal layer before forming the first insulating layer. The method may further comprise forming a passivation layer before forming the first insulating layer.

According to embodiments, the first insulating layer is formed over horizontal regions of the contact layer, and the method comprises subsequently removing the first insulating layer from horizontal regions of the workpiece before applying the second insulating layer.

According to further embodiments, a method of manufacturing an optoelectronic semiconductor device comprises forming a layer stack comprising a first semiconductor layer of a first conductivity type and a second semiconductor layer of a second conductivity type, forming an electrically conductive first contact layer in direct contact with the first semiconductor layer, a maximum lateral extension of the second semiconductor layer being greater than the maximum lateral extension of the first semiconductor layer, so that a workpiece comprising a step structure is formed, and conformally forming a passivation layer over a side surface of the first contact layer. The method further includes forming a first insulating layer over the resulting workpiece, removing parts of the first insulating layer from a horizontal surface of the workpiece, forming a second insulating layer over a horizontal surface of the first contact layer, a layer thickness of the second insulating layer being smaller than the smallest layer thickness of the first insulating layer over the step structure, and forming a second current spreading structure over the second insulating layer, wherein the first contact layer is electrically connected to the second semiconductor layer.

For example, forming the first insulating layer may comprise forming a first insulating layer, such that a horizontal surface of the first insulating layer has a minimum distance from a first main surface of the second semiconductor layer which is greater than a maximum distance between a first main surface the passivation layer and the first main surface of the second semiconductor layer.

According to embodiments, an optoelectronic semiconductor apparatus comprises the optoelectronic semiconductor device as described above.

BRIEF DESCRIPTION OF THE DRAWINGS

The accompanying drawings serve to provide an understanding of exemplary embodiments. The drawings illustrate exemplary embodiments and, together with the description, serve for explanation thereof. Further exemplary embodiments and many of the intended advantages will become apparent directly from the following detailed description. The elements and structures shown in the drawings are not necessarily shown to scale relative to each other. Like reference numerals refer to like or corresponding elements and structures.

DETAILED DESCRIPTION

Figure 1A:
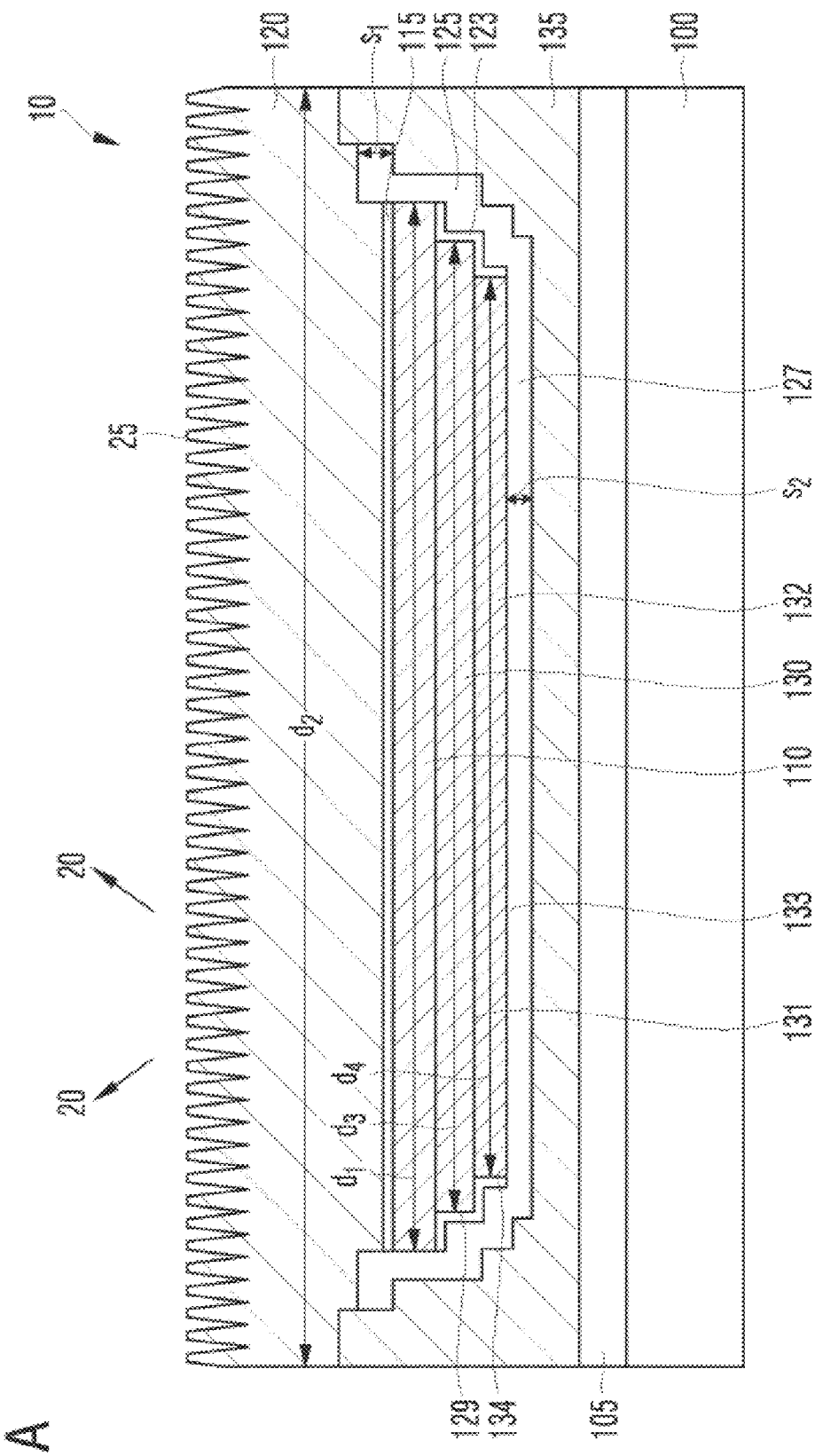
FIG. 1A shows a schematic cross-sectional view of an optoelectronic semiconductor device according to embodiments.

In the following detailed description, reference is made to the accompanying drawings, which form a part of the disclosure and in which specific exemplary embodiments are shown for purposes of illustration. In this context, directional terminology such as "top", "bottom", "front", "back", "over", "on", "in front", "behind", "leading", "trailing", etc. refers to the orientation of the figures just described. As the components of the exemplary embodiments may be positioned in different orientations, the directional terminology is used by way of explanation only and is in no way intended to be limiting.

The description of the exemplary embodiments is not limiting, since there are also other exemplary embodiments, and structural or logical changes may be made without departing from the scope as defined by the patent claims. In particular, elements of the exemplary embodiments described below may be combined with elements from others of the exemplary embodiments described, unless the context indicates otherwise.

The semiconductor materials mentioned in the context of the present description may in particular be based on a direct semiconductor material. Examples of semiconductor materials particularly suitable for generating electromagnetic radiation include, without limitation, nitride semiconductor compounds, by means of which, for example, ultraviolet, blue or longer-wave light may be generated, such as GaN, InGaN, AlN, AlGaN, AlGaInN, AlGaInBN, phosphide semiconductor compounds by means of which, for example, green or longer-wave light may be generated, such as GaAsP, AlGaInP, GaP, AlGaP, and other semiconductor materials such as GaAs, AlGaAs, InGaAs, AlInGaAs, SiC, ZnSe, ZnO, $Ga_2O_3$, diamond, hexagonal BN and combinations of the materials mentioned. The stoichiometric ratio of the compound semiconductor materials may vary. Other examples of semiconductor materials may include silicon, silicon germanium, and germanium. In the context of the present description, the term "semiconductor" also includes organic semiconductor materials.

The terms "lateral" and "horizontal", as used in the present description, are intended to describe an orientation or alignment which extends essentially parallel to a first surface of a semiconductor substrate or semiconductor body. This may be the surface of a wafer or a chip (die), for example.

The horizontal direction may, for example, be in a plane perpendicular to a direction of growth when layers are grown.

The term "vertical", as used in this description, is intended to describe an orientation which is essentially perpendicular to the first surface of a substrate or semiconductor body. The vertical direction may correspond, for example, to a direction of growth when layers are grown.

To the extent used herein, the terms "have", "include", "comprise", and the like are open-ended terms that indicate the presence of said elements or features, but do not exclude the presence of further elements or features. The indefinite articles and the definite articles include both the plural and the singular, unless the context clearly indicates otherwise.

In the context of this description, the term "electrically connected" means a low-ohmic electrical connection between the connected elements. The electrically connected elements need not necessarily be directly connected to one another. Further elements may be arranged between electrically connected elements.

The term "electrically connected" also encompasses tunnel contacts between the connected elements.

FIG. 1A shows a vertical cross-sectional view of an optoelectronic semiconductor device according to embodiments. The optoelectronic semiconductor device 10 comprises a first semiconductor layer 110 of a first conductivity type, for example p-type, and a second semiconductor layer 120 of a second conductivity type, for example n-type. The first semiconductor layer 110 and the second semiconductor layer 120 are stacked on top of each another to form a semiconductor layer stack. An active zone 115 may be arranged between the first semiconductor layer 110 and the second semiconductor layer 120. For example, the active zone may be suitable for generating or receiving electromagnetic radiation 20. For example, the generated electromagnetic radiation 20 may be output via a first main surface 25 of the optoelectronic semiconductor device 10. Furthermore, incident electromagnetic radiation may penetrate into the semiconductor layer stack via the main surface 25 of the optoelectronic semiconductor device 10. For example, the first main surface 25 of the optoelectronic semiconductor device 10 may be patterned to increase the outcoupling efficiency.

The active zone may, for example, comprise a pn junction, a double heterostructure, a single quantum well structure (SQW, single quantum well) or a multiple quantum well structure (MQW, multi quantum well) for generating radiation. The term "quantum well structure" does not imply any particular meaning here with regard to the dimensionality of the quantization. Therefore it includes, among other things, quantum wells, quantum wires and quantum dots as well as any combination of these layers.

A first contact layer 130 is formed directly adjacent to the first semiconductor layer 110. For example, the first contact layer 130 may contain a highly reflective material such as silver. According to embodiments, the first contact layer 130 may also comprise several sub-layers, for example a transparent partial layer on the side of the first semiconductor layer 130 and a sub-layer that includes a highly reflective material. The transparent sub-layer may, for example, contain zinc oxide or indium tin oxide (ITO). According to embodiments, a first current spreading layer 132 may furthermore be arranged on the first main surface 131 of the contact layer 130 facing away from the first semiconductor layer 110.

A lateral extension d2 of the second semiconductor layer 120 is greater than a lateral extension d1 of the first semiconductor layer 110. Furthermore, the lateral extension d1 of the first semiconductor layer 110 is greater than the lateral extension d3 of the contact layer 130. Correspondingly, a step structure is formed by the second semiconductor layer 120, the first semiconductor layer 110 and the first contact layer 130. A lateral extension d4 of the first current spreading layer 132 may furthermore be smaller than the lateral extension d3 of the first contact layer 130. In this case, the step structure accordingly also comprises the first current spreading layer 132. According to further embodiments, the first current spreading layer 132 may also form over the first contact layer 130. For example, in this case a part of the first current spreading layer 132 is arranged adjacent to side walls 129 of the first contact layer 130, thus encapsulating them. This is illustrated in more detail with reference to FIGS. 3A to 3D. For example, a material of the first current spreading layer 132 may be Au, Cu, Al, Ti, Pt or Pd.

The first insulating layer 125 is now arranged on a side flank of the resulting layer structure and covers the step structure. The optoelectronic semiconductor device 10 furthermore comprises a second current spreading structure 135, which is connected to the second semiconductor layer 120 in an electrically conductive manner. The second current spreading structure 135 is arranged on a side of the first contact layer 130 or the first current spreading layer 132 facing away from the first semiconductor layer. A material of the second current spreading structure 135 may comprise aluminum, for example.

A second insulating layer 127 is arranged between a horizontal surface 131 of the first contact layer 130 and the second current spreading structure 135. For example, the second insulating layer 127 may be directly adjacent to the horizontal surface 133 of the first current spreading layer 132. A layer thickness of the second insulating layer 127 is smaller than the smallest layer thickness of the first insulating layer 125 over the step structure.

For example, a material of the second insulating layer 127 may be identical to the material of the first insulating layer 125. According to further embodiments, the material of the second insulating layer 127 may be different from the material of the first insulating layer 125. For example, the first insulating layer 125 may comprise a layer stack comprising silicon oxide, silicon nitride or a combination of these materials.

According to embodiments, a passivation layer 123 may be formed over at least a part of the step structure. For example, the passivation layer 123 may contain an insulating material, for example aluminum oxide. For example, the passivation layer 123 may cover side surfaces 129 of the first contact layer 130 as well as exposed horizontal regions of the adjacent first semiconductor layer 110. In particular, the passivation layer may be arranged over exposed surface areas of the first contact layer 130. The passivation layer 123 may furthermore cover the horizontal surface 133 of the first current spreading layer 132. The passivation layer 123 may be formed, for example, as a conformal layer, for example by ALD ("Atomic Layer Deposition") processes, so that the first contact layer 130 is encapsulated by the passivation layer and migration of silver ions is suppressed or prevented. The passivation layer 123 may be suitable for constituting a chemical barrier against corrosive gases. Moreover, the passivation layer 123 constitutes a protective layer against environmental influences.

In the optoelectronic semiconductor device illustrated in FIG. 1A, the second insulating layer 127 serves for electrical insulation between conductive layers, which are electrically connected to the first semiconductor layer 110, and the second current spreading structure 135. A layer thickness s2 of the second insulating layer 127 may be dimensioned such that it avoids an electrical breakdown between the second current spreading structure 135 and electrically conductive layers which are connected to the first semiconductor layer 110. For example, a layer thickness s2 of the second insulating layer 127 may be smaller than 300 nm, for example smaller than 200 nm or smaller than 150 nm. For example, at a layer thickness S2 of approximately 100 nm, effective protection against breakdown at a voltage of up to approximately 50 V may be prevented. The first insulating layer 125, which covers the step structure of the first and the second semiconductor layer, also prevents an electrical breakdown between the second current spreading structure 135 and the first semiconductor layer 110 and the conductive layers connected to the first semiconductor layer In order to optimally insulate this step structure, a layer thickness s1 is used which is greater than a layer thickness s2 of the second insulating layer 127, which is arranged over the horizontal main surface of the first contact layer 130 or the first current spreading layer 132. The first insulating layer 125 is formed as a conformal layer. That is to say, a step structure is formed in the first insulating layer 125 which corresponds approximately to the step structure of the base material, i.e., the second semiconductor layer 120, the first semiconductor layer 110 and the first contact layer 130 and optionally the first current spreading layer 132. For example, the thickness s2 of the second insulating layer 127 may be less than half the thickness s1 or even less than a third of the thickness s1 of the first insulating layer 125.

As will be explained below, the first insulating layer 125 and the second insulating layer 127 may, for example, each be produced by different processes. Accordingly, the first and the second insulating layers 125, 127 may be optimized depending on the application. Due to the reduced layer thickness of the second insulating layer 127, the thermal resistance between the first contact layer 130 and the second current spreading structure 135 is greatly reduced. For example, a smallest layer thickness s1 of the first insulating layer 125 may be approximately 600 nm. If the layer thickness s2 of the second insulating layer 127, compared to this value, is reduced to values as described above, the thermal resistance of the insulating layer may be reduced by approximately 80%. For example, the thermal resistance of the first insulating layer 125, 126 may be 0.6 K/W. The thermal resistance of the second insulating layer 127 may be 0.1 K/W.

The second insulating layer 127 overlaps with the active zone 115 in which the electromagnetic radiation is generated. As a result, the heat in the area in which it is generated may be dissipated immediately. As a result, the optoelectronic semiconductor device is cooled and the optical output power and thus the efficiency of the optoelectronic semiconductor device are increased. Furthermore, due to the reduced thermal resistance, a conversion layer over the first main surface 25 of the optoelectronic semiconductor device may also be cooled in an improved manner. Consequently, the temperature in the optoelectronic semiconductor device in the converter material and in packaging materials is reduced. As a result, the LED has a longer service life.

By having the passivation layer 123, for example, arranged directly adjacent to the side surface 129 and neighboring horizontal surfaces of neighboring layers, an efficient encapsulation of the first contact layer 130 may be effected. If the layer thicknesses of the first insulating layer 125 and the second insulating layer 127 are set independently of one another, the layer thickness of the first insulating layer 125 may be selected to be comparatively large without the thermal resistance of the second insulating layer 127 being increased as a result. Accordingly, the robustness of the device against dielectric breakdown or against corrosive chemicals is not impaired. As a further consequence of the increased layer thickness of the first insulating layer 125, the layer thickness of the first current spreading layer 132 may also be increased further. For example, the first current spreading layer may have a layer thickness of approximately 400 to 600 nm, for example 500 nm. Consequently, current spreading in the first semiconductor layer 110 may be improved and may be made more uniform. As a result, the maximum current may be increased, whereby the emission from the optoelectronic semiconductor device may be increased.

The optoelectronic semiconductor device 10 may furthermore comprise a carrier 100, for example a silicon carrier. For example, the silicon carrier 100 may be connected to the second current spreading structure 135 by a suitable connecting material 105, for example solder.

Figure 1B:
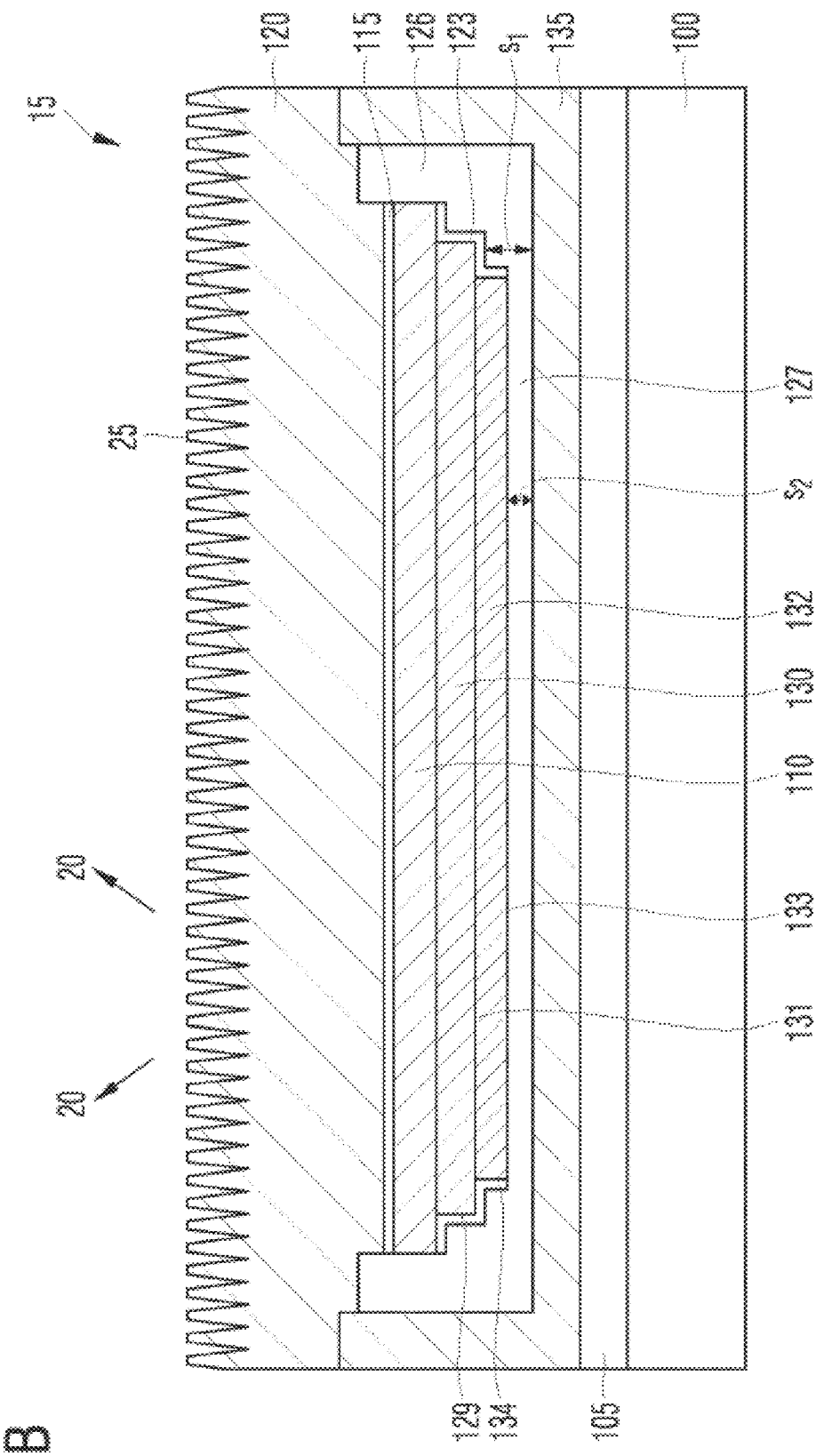
FIG. 1B shows a schematic cross-sectional view of an optoelectronic semiconductor device according to further embodiments.

FIG. 1B shows a vertical cross-sectional view of an optoelectronic semiconductor device according to further embodiments. In contrast to the structure shown in FIG. 1A, the first insulating layer 126 is not formed here as a conformal layer over the step structure. Rather, the first insulating layer 126 is formed as a planarizing layer over the step structure. As shown in FIG. 1B, the passivation layer 123 is arranged adjacent to the side surfaces 129 of the first contact layer 130 and over exposed horizontal surface areas of the adjacent first semiconductor layer 110 and over an exposed part of the first main surface 131 of the first contact layer 130. Furthermore, the passivation layer 123 may be arranged adjacent to side surfaces 134 of the first current spreading layer 132.

According to embodiments, a part of the passivation layer may also be arranged adjacent to the first main surface 133 of the first current spreading layer 132 or adjacent to the first main surface 131 of the first contact layer 130.

Figure 2A:
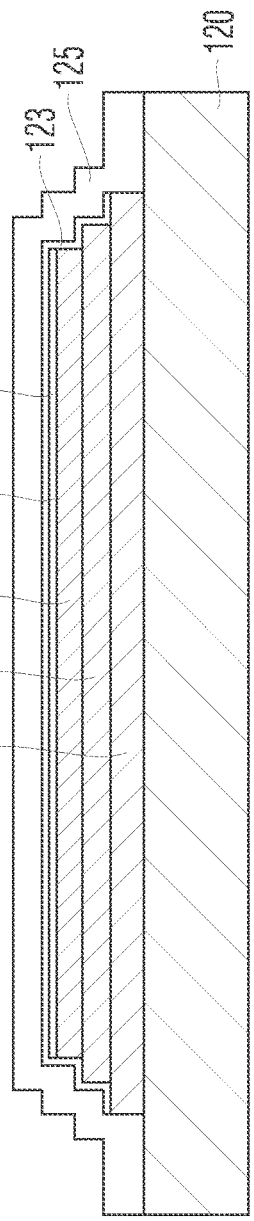
FIGS. 2A to 2F illustrate schematic cross-sectional views of a workpiece in the course of performing a method according to embodiments.

FIGS. 2A to 2F illustrate vertical cross-sectional views of a workpiece during manufacture of the optoelectronic semiconductor device according to embodiments. A second semiconductor layer 120 is applied over a growth substrate (not shown in FIG. 2) by an epitaxial process, optionally followed by layers for forming the active zone (not shown in the following figures) and the first semiconductor layer 110. Furthermore, the first contact layer 130 and optionally the first current spreading layer 132 are applied over the first semiconductor layer 110. Additionally, a sacrificial metal layer 137 may be formed over the first current spreading layer 132. For example, the first current spreading layer 132 may include gold. The sacrificial metal layer 137 may, for example, include a harder metal than gold, for example chromium or nickel. A layer thickness of the sacrificial metal layer 137 may, for example, be a maximum of 200 nm, for example less than 150 nm. The applied layers are patterned, thereby forming a step structure as shown in FIG. 2A. For example, part of a surface of the second semiconductor layer 120 is not covered with the first semiconductor layer 110. Part of a surface of the first semiconductor layer 110 may not be covered with the first contact layer 130. Part of the first contact layer 130 may not be covered with the first current spreading layer 132.

A passivation layer, for example made of $Al_2O_3$, is then applied conformally over the first semiconductor layer 110, the exposed areas of the first contact layer 130, the first current spreading layer 132, if applicable, and over the sacrificial metal layer 137. A conformal layer is formed. For example, a layer thickness of the passivation layer 123 may be more than 20 nm, for example approximately 30 to 50 nm, for example 40 nm. A layer thickness of the passivation layer 123 may be less than 100 nm, for example. The first insulating layer 125 is then applied over the entire surface area. For example, a layer thickness of the first insulating layer 125 may be more than 400 nm, for example approximately 600 nm. The first insulating Layer 125 may have multiple layers, for example. For example, the layers may include silicon oxide and silicon nitride. The first insulating layer 125 may be formed conformally over the step structure. Part of the first insulating layer 125 is directly adjacent to the first and second semiconductor layers 110, 120.

FIG. 2A shows an example of a resulting cross sectional view. A surface of the sacrificial metal layer 137 is then exposed. For example, this may be done by a polishing process, for example a CMP process ("chemical-mechanical polishing"). An end of this polishing step may be recognized, for example, by a reduced resistance. The end of this polishing step may also be recognized by the fact that the surface of the sacrificial metal layer 137 has been reached.

Figure 2B:
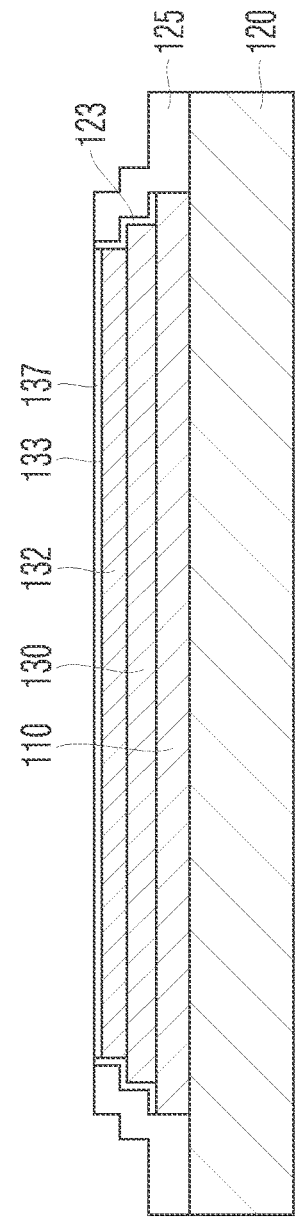

FIG. 2B shows a cross-sectional view of a resulting workpiece. As shown in FIG. 2B, a horizontal surface over the first contact layer is now exposed or not covered with insulating material. The remaining sacrificial metal layer 137 may then be removed from the surface of the first current spreading layer 132, for example by means of a selective etching process. According to further embodiments, however, it may also remain.

Figure 2C:
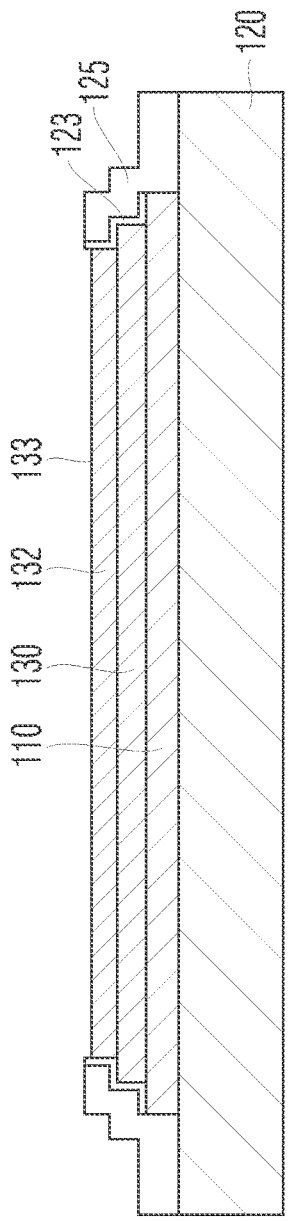

FIG. 2C shows an example of a resulting workpiece. The second insulating layer 127 is then applied. The second insulating layer 127 has a layer thickness s2 which is smaller than the smallest vertical layer thickness s1 of the first insulating layer 125. In the case of a step structure, the smallest vertical layer thickness s1 corresponds to that layer thickness which would be deposited if a horizontal surface were present instead of the step structure. For example, the step structure may have larger horizontal areas, over which the first insulating layer 125 of constant smallest layer thickness s1 is deposited.

Figure 2D:
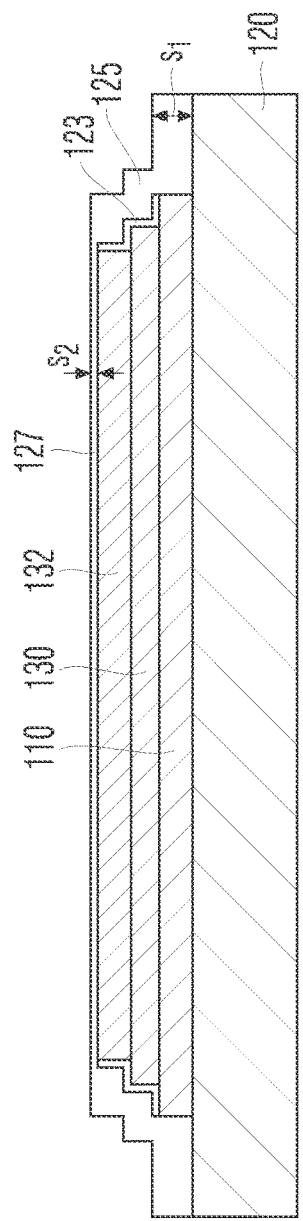

FIG. 2D shows a cross-sectional view of a resulting example. The first insulating layer may then be further patterned using photolithographic processes, for example. For example, part of the first insulating layer 125 over horizontal regions of the second semiconductor layer 120 may be removed.

Figure 2E:
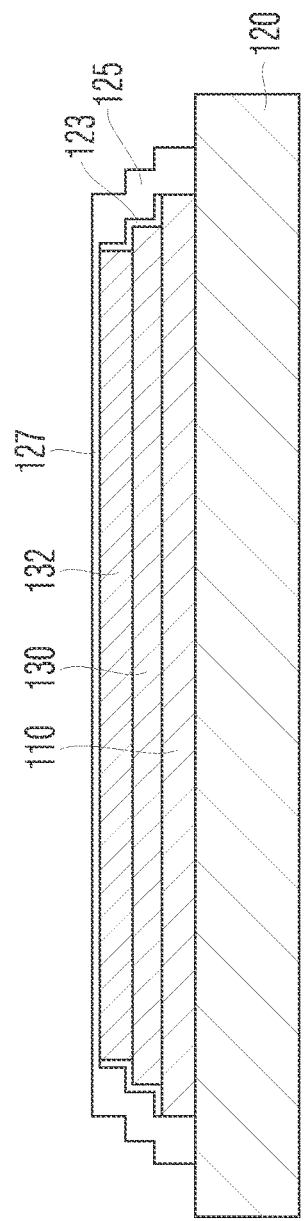

FIG. 2E shows a cross-sectional view of a resulting workpiece. The electrically conductive material of the second current spreading structure 135 may then be formed over the resulting surface.

Figure 2F:
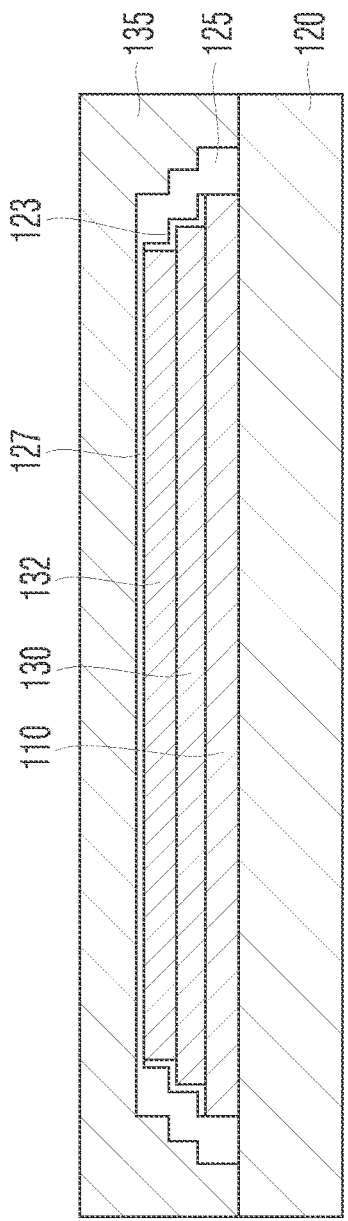

FIG. 2F shows an example of a cross-sectional view of a resulting workpiece. In those locations where the first insulating layer 125 has been removed from horizontal regions of the second semiconductor layer 120, the second current spreading structure 135 is electrically connected to the second semiconductor layer 120.

FIGS. 3A to 3D illustrate a method in which the first insulating layer 126 is not deposited as a conformal layer, but rather by a leveling process or with a greater layer thickness than the layer stack to be overmolded. If the first insulating layer 126 has a layer thickness which is greater than the height of the stack to be overmolded, the space produced between two stacks to be overmolded is completely filled by the first insulating layer 126.

Figure 3A:
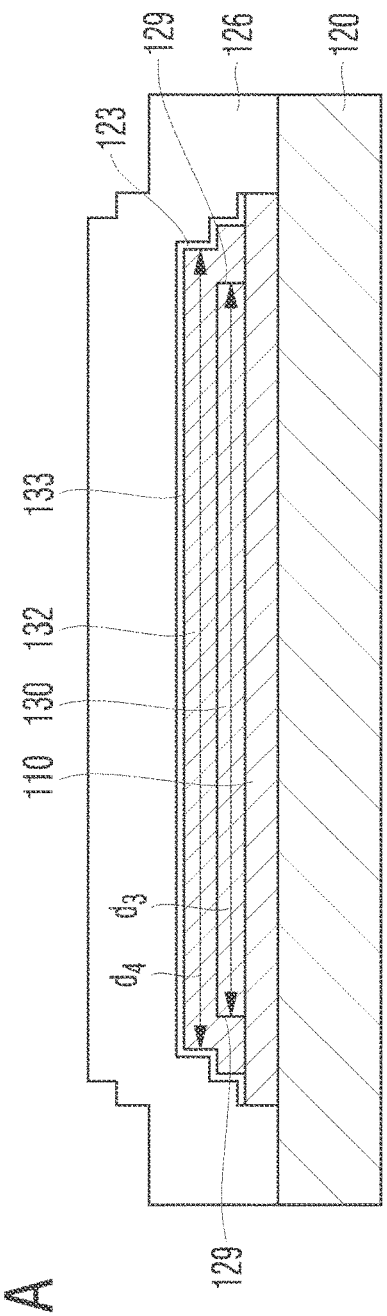
FIGS. 3A to 3D illustrate schematic cross-sectional views of a workpiece in the course of performing the method according to embodiments.

FIG. 3A shows a workpiece having a layer stack which is formed in a manner similar to that in FIG. 2A. A conformal passivation layer 123 is provided both over the horizontal surface 133 of the first current spreading layer 132 and over the side flanks and exposed surface areas of the step structure of the layer stack. As shown in FIG. 3A, the first insulating layer 126 is thicker than the height of the layer stack to be overmolded. According to embodiments, a sacrificial metal layer (not shown in FIG. 3A) may additionally be formed over the first main surface 133 of the first current spreading layer 132. First, a polishing process, for example a CMP process, is carried out, as a result of which, for example, a smooth, topography-free horizontal surface of the workpiece is obtained. For example, an end point of this polishing process may be recognized by the fact that the frictional force is minimal.

Figure 3B:
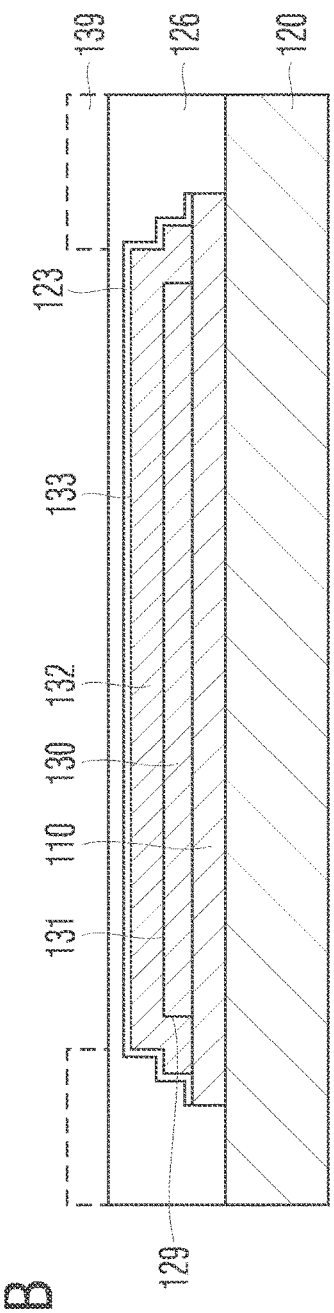

Subsequently, in accordance with embodiments, a photoresist mask 139 may be formed over the resulting surface. FIG. 3B shows a cross-sectional view of an example of a resulting workpiece with a photoresist mask 139.

According to further embodiments, however, with suitable process control in place, further processing may also take place without a photo resist mask 139.

An etching process is then carried out in order to expose a first main surface 133 of the first current spreading layer 132 or, if applicable, of the sacrificial metal layer 137. For example, this may include an isotropic etching process, for example also a plasma etching process. According to embodiments, this process may stop on the sacrificial metal layer 137.

Figure 3C:
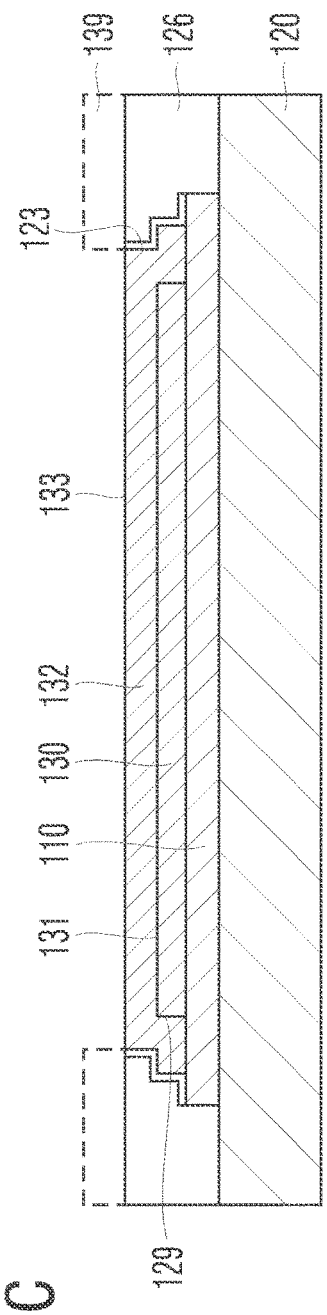

FIG. 3C shows an example of a resulting workpiece. After removing the optional photoresist mask 137, a thin second insulating layer 127 is formed over the resulting surface. A layer thickness s2 of the second insulating layer 127 may be selected, for example, in order to ensure sufficient insulation between the first current spreading layer 132 and the second current spreading structure to be applied. For example, a layer thickness s2 of the second insulating layer 127 may be smaller than the layer thickness s1 of the first insulating layer 126. For example, the layer thickness s1 of the first insulating layer 126 may correspond to the smallest vertical dimension of the first insulating layer 126 over the step structure. According to further embodiments, the layer thickness s2 of the second insulating layer may be less than half or a third of the layer thickness s1 of the first insulating layer 126. For example, the layer thickness s2 of the second insulating layer may be less than 200 nm, for example less than 150 nm, for example approximately 100 nm.

Figure 3D:
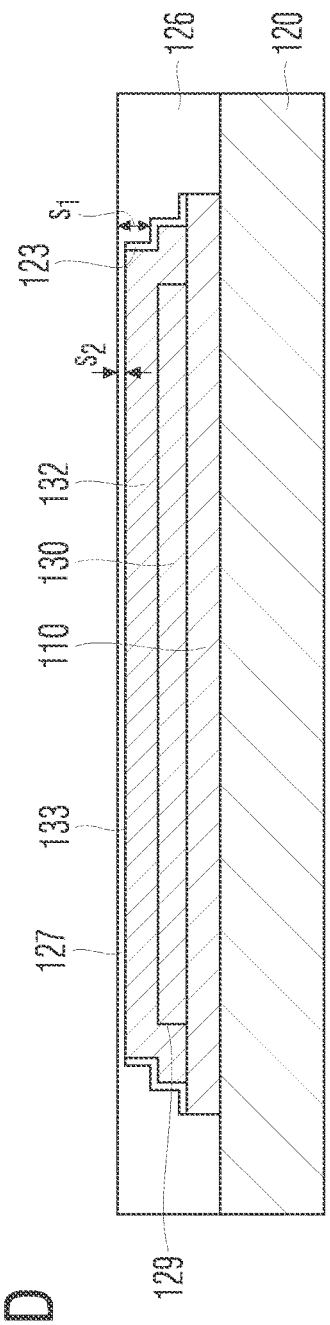

FIG. 3D shows a cross-sectional view of a resulting workpiece. Further processing of the workpiece may take place as described with reference to FIGS. 2E to 2F.

According to a modification of embodiments described in FIGS. 3A to 3D, the polishing process may also be carried out starting from the structure shown in FIG. 3A, until a surface of the first current spreading layer 132 or the sacrificial metal layer 137 is uncovered. Then, as described with reference to FIGS. 3C and 3D, the second insulating layer 127 may be formed.

In the following variant of the method, the first insulating layer 125 is again deposited as a conformal layer and then patterned by a masked etch.

Figure 4A:
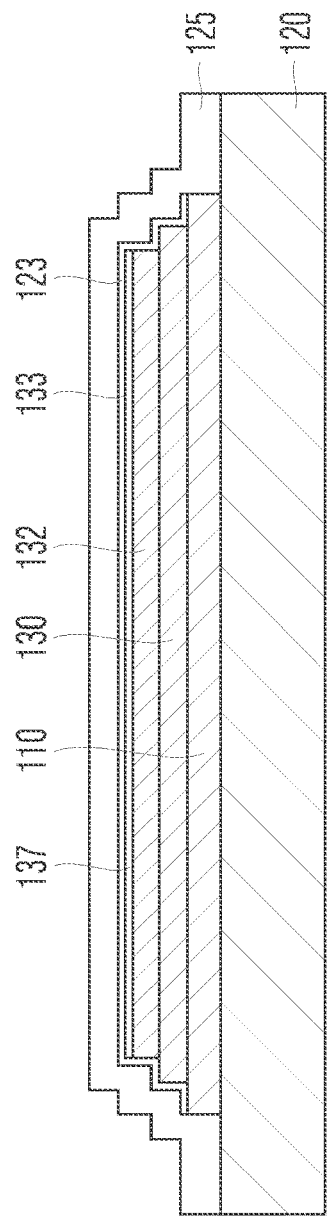
FIGS. 4A to 4D illustrate schematic cross-sectional views of a workpiece in the course of performing a method according to embodiments.
Figure 4B:
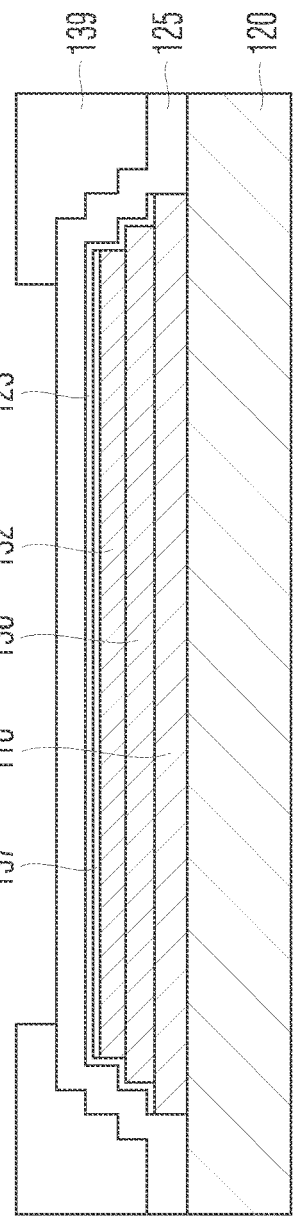

FIG. 4A shows a workpiece which is formed in a manner similar to that shown in FIG. 2A. Optionally, a sacrificial metal layer 137 may be formed over the first major surface 133 of the first current spreading layer 132. According to further embodiments, the sacrificial metal layer 137 may be omitted. A photomask 139 is formed which leaves the horizontal surface 133 of the first current spreading layer 132 largely uncovered. FIG. 4B shows an example of a resulting workpiece. An etching process is then carried out, as a result of which a horizontal surface 133 of the first current spreading layer 132 is exposed. If the sacrificial metal layer 137 is present, a surface of the sacrificial metal layer 137 is also exposed in this step.

Figure 4C:
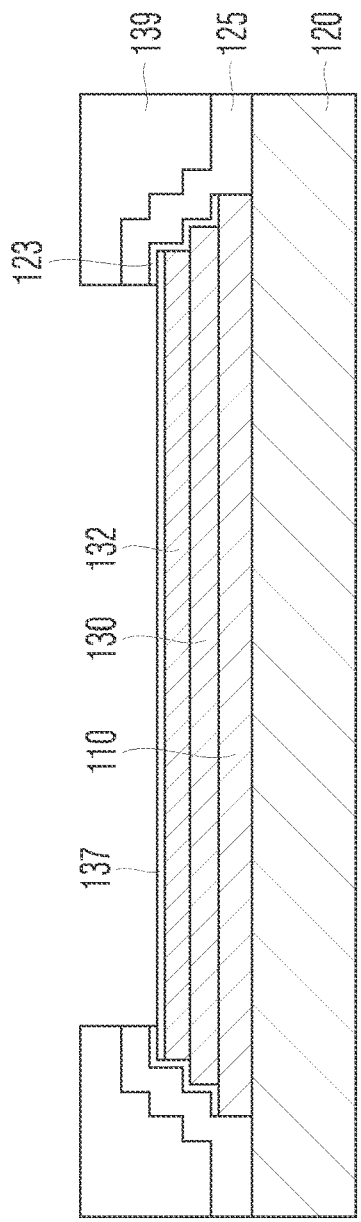

FIG. 4C shows an example of a resulting workpiece. After removing the photoresist material 139, a thin second insulating layer 127 is deposited over the resulting structure.

Figure 4D:
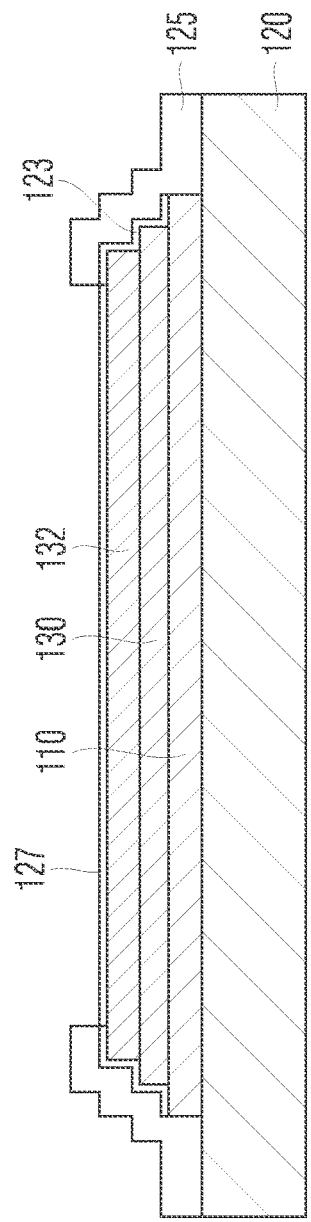

FIG. 4D shows an example of a resulting workpiece. Processes similar to those described with reference to FIGS. 2E and 2F may then be carried out.

According to the embodiments described herein, the second insulating layer 127 may be deposited by a different method than the first insulating layer 125, 126. For example, a sputtering or vapor deposition may be performed to form the second insulating layer 127. In contrast, the conformal first insulating layer 125 is formed, for example, by an ALD method, by means of which a reliable overmolding of the step structure is ensured.

Figure 5:
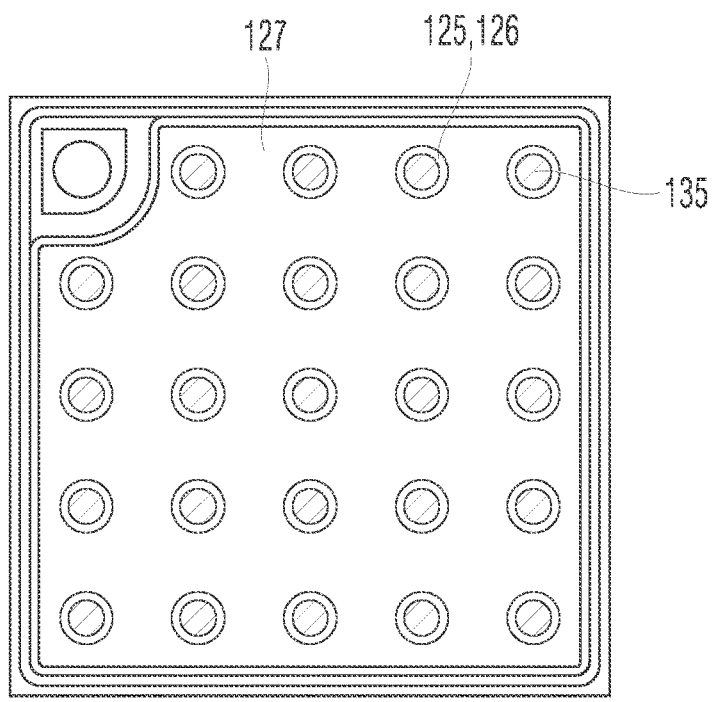
FIG. 5 illustrates a schematic horizontal cross-sectional view of an optoelectronic semiconductor device according to the embodiment.

FIG. 5 illustrates a horizontal cross-sectional view of the optoelectronic semiconductor device. FIG. 5 illustrates in particular the area proportions of the second insulating layer 127 in comparison to the area proportions of the first insulating layer 125, 126. The second insulating layer 127 takes up a significantly larger part of the area than the first insulating layer 125, 126. Accordingly, by reducing the thermal resistance in the region of the second insulating layer 127, the heat dissipation may be significantly improved. More precisely, the presence of the second insulating layer 127 having a reduced layer thickness may reduce the thermal resistance in a region of approximately 90% of the chip surface. As a result, the thermal resistance may be reduced by about 70 to 80%. Correspondingly, the efficiency and service life of the semiconductor device may be greatly increased. Furthermore, heat may be dissipated via the second contact structures 135.

Figure 6A:
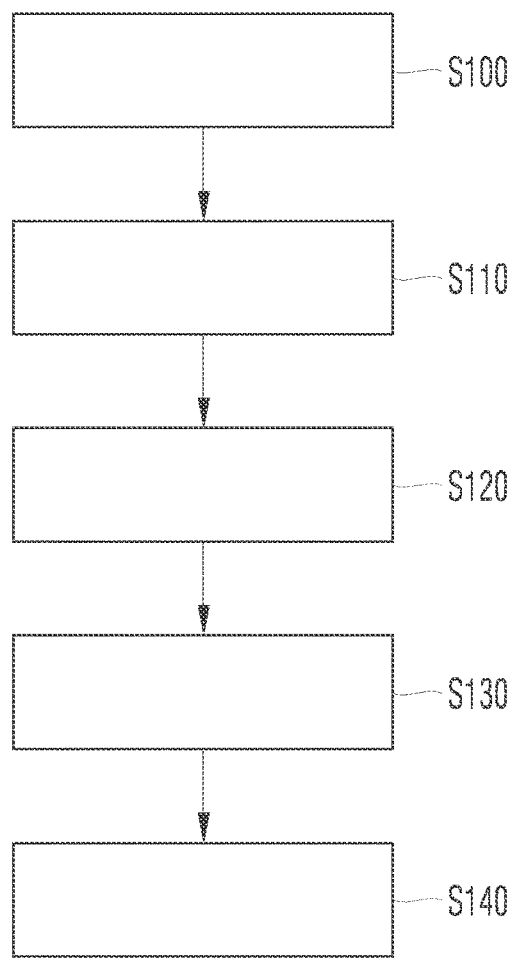
FIGS. 6A and 6B show flow charts to illustrate the method according to embodiments.

FIG. 6A outlines a method according to embodiments. A method of manufacturing an optoelectronic semiconductor device comprises forming a layer stack (S100) which comprises a first semiconductor layer of a first conductivity type and a second semiconductor layer of a second conductivity type and forming (S110) an electrically conductive first contact layer in direct contact with of the first semiconductor layer, a lateral extension of the second semiconductor layer being greater than the lateral extension of the first semiconductor layer, so that a workpiece with a step structure is formed. The method further comprises conformally forming (S120) a first insulating layer over the step structure of the first and second semiconductor layers, forming (S130) a second insulating layer over a horizontal surface of the first contact layer, a layer thickness of the second insulating layer being smaller than the smallest layer thickness of the first insulating layer over the step structure, and forming (S140) a second current spreading structure over the second insulating layer, the second contact structure being electrically connected with the second semiconductor layer.

Figure 6B:
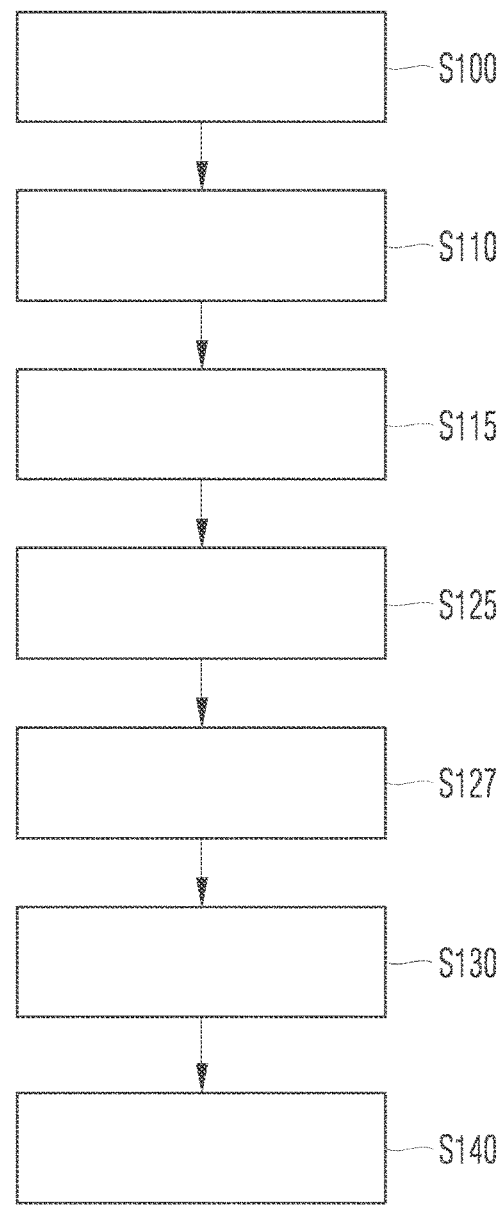

FIG. 6B outlines a method according to further embodiments. A method of manufacturing an optoelectronic semiconductor device comprises forming (S100) a layer stack which comprises a first semiconductor layer of a first conductivity type and a second semiconductor layer of a second conductivity type and forming (S110) an electrically conductive first contact layer in direct contact with the first semiconductor layer, a lateral extension of the second semiconductor layer being greater than the lateral extension of the first semiconductor layer, so that a workpiece with a step structure is formed. The method further comprises conformally forming (S115) a passivation layer over a side surface of the first contact layer, forming (S125) a first insulating layer over the resulting workpiece. The method further comprises removing (S127) parts of the first insulating layer from a horizontal surface of the workpiece, forming (S130) a second insulating layer over a horizontal surface of the first contact layer, a layer thickness of the second insulating layer being less than the smallest layer thickness of the first insulating layer over the step structure, and forming (S140) a second current spreading structure over the second insulating layer, the first contact layer being electrically connected to the second semiconductor layer.

Figure 7:
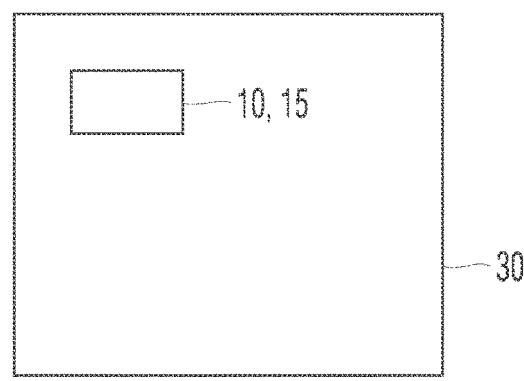
FIG. 7 shows an optoelectronic apparatus according to the embodiment.

FIG. 7 shows an optoelectronic semiconductor apparatus 30 according to embodiments. The optoelectronic semiconductor apparatus 30 comprises the optoelectronic semiconductor device 10, 15 described above. The optoelectronic semiconductor apparatus 30 may, for example, be a motor vehicle headlight or a very powerful lighting device, for example a headlight for stage shows. Because of the improved heat dissipation, the power density of the optoelectronic semiconductor apparatus may be increased. For example, the optoelectronic semiconductor apparatus may be operated at a power density of more than 3-4 watts/mm$^2$, for example more than 10 watts/mm$^2$. Accordingly, the output may be increased while retaining the same surface area. Furthermore, the surface area of the optoelectronic semiconductor apparatus may be reduced, for example while retaining the same output. This also enables smaller optics to be used for the optoelectronic semiconductor apparatus. As a result, space and costs may be saved.

Although specific embodiments have been illustrated and described herein, those skilled in the art will recognize that the specific embodiments shown and described may be replaced by a multiplicity of alternative and/or equivalent configurations without departing from the scope of the invention. The application is intended to cover any adaptations or variations of the specific embodiments discussed herein. Therefore, the invention is to be limited by the claims and their equivalents only.

LIST OF REFERENCES 10 optoelectronic semiconductor device
15 optoelectronic semiconductor device
20 electromagnetic radiation
25 first main surface of the optoelectronic semiconductor device
30 optoelectronic semiconductor apparatus
100 carrier
105 connecting material
110 first semiconductor layer
115 active zone
120 second semiconductor layer
123 passivation layer
125 first insulating layer
126 first insulating layer
127 second insulating layer
129 side surface of the first contact layer
130 first contact layer 131 horizontal surface of the first contact layer
132 first current spreading layer
133 horizontal surface of the first current spreading layer
134 side surface of the first current spreading layer
135 second current spreading structure
137 sacrificial metal layer
139 photoresist mask

The invention claimed is:

1. An optoelectronic semiconductor device comprising:
a first semiconductor layer of a first conductivity type;
a second semiconductor layer of a second conductivity type, the first and second semiconductor layers being stacked on top of each other to form a semiconductor layer stack;
a first contact layer arranged in direct contact with the first semiconductor layer and where the first contact layer is electrically conductive;
a first insulating layer formed over the first and second semiconductor layers;
a second current spreading structure electrically connected to the second semiconductor layer;
wherein a maximum lateral extension of the second semiconductor layer is greater than the maximum lateral extension of the first semiconductor layer, such that a step structure is formed and the first insulating layer is formed as a conformal layer over the step structure of the first and the second semiconductor layers and is directly adjacent to the first and second semiconductor layers, respectively; and
a second insulating layer arranged between a horizontal surface of the first contact layer and the second current spreading structure, the second insulating layer being arranged directly adjacent to the horizontal surface of the first contact layer and being arranged directly adjacent to the second current spreading structure, wherein a layer thickness of the second insulating layer is smaller than the smallest layer thickness of the first insulating layer over the step structure.

2. The optoelectronic semiconductor device according to claim 1, further comprising a first current spreading layer arranged on a side of the first contact layer facing away from the first semiconductor layer and in direct contact with the first contact layer.

3. The optoelectronic semiconductor device according to claim 2, wherein a lateral extension of the first current spreading layer is smaller than the lateral extension of the contact layer.

4. The optoelectronic semiconductor device according to claim 2, wherein the first current spreading layer is directly adjacent to at least two side surfaces of the contact layer.

5. The optoelectronic semiconductor device according to claim 1, further comprising a passivation layer directly adjacent to exposed regions of the step structure.

6. The optoelectronic semiconductor device according to claim 5, wherein the passivation layer is absent from a horizontal surface of the first current spreading layer.

7. The optoelectronic semiconductor device according to claim 1, wherein the second insulating layer is arranged directly adjacent to the entire horizontal surface of the first contact layer.

8. An optoelectronic semiconductor device comprising:
a first semiconductor layer of a first conductivity type;
a second semiconductor layer of a second conductivity type, the first and second semiconductor layers being stacked on top of each other to form a semiconductor layer stack;
a first contact layer arranged in direct contact with the first semiconductor layer and where the first contact layer is electrically conductive;
a passivation layer;
a first insulating layer formed over the first and second semiconductor layers;
a second current spreading structure electrically connected to the second semiconductor layer;
wherein a lateral extension of the second semiconductor layer is greater than the lateral extension of the first semiconductor layer, such that a step structure is formed, and the passivation layer is formed as a conformal layer over a side surface of the contact layer; and
a second insulating layer arranged between a horizontal surface of the first contact layer and the second current spreading structure, the second insulating layer being arranged directly adjacent to the horizontal surface of the first contact layer and being arranged directly adjacent to the second current spreading structure, wherein a layer thickness of the second insulating layer is smaller than the smallest layer thickness of the first insulating layer over the step structure.

9. The optoelectronic semiconductor device according to claim 8, wherein the first insulating layer is directly adjacent to the first and second semiconductor layers.

10. The optoelectronic semiconductor device according to claim 8, further comprising a first current spreading layer arranged on a side of the first contact layer facing away from the first semiconductor layer and in direct contact with the first contact layer, wherein the passivation layer is adjacent to a side surface of the contact layer.

11. The optoelectronic semiconductor device according to claim 10, wherein the lateral extension of the first current spreading layer is smaller than the lateral extension of the contact layer.

12. The optoelectronic semiconductor device according to claim 10, wherein the current spreading layer is directly adjacent to at least two side surfaces of the contact layer.

13. The optoelectronic semiconductor device according to claim 10, wherein the passivation layer is absent from a horizontal surface of the first current spreading layer.

14. The optoelectronic semiconductor device according to claim 8, wherein the layer thickness of the second insulating layer is less than half the smallest layer thickness of the first insulating layer over the step structure.

15. The optoelectronic semiconductor device according to claim 8, wherein the layer thickness of the second insulating layer is less than a third of the smallest layer thickness of the first insulating layer over the step structure.

16. The optoelectronic semiconductor device according to claim 8, wherein the second insulating layer is arranged directly adjacent to the entire horizontal surface of the first contact layer.

17. A method of manufacturing an optoelectronic semiconductor device comprising:
forming a layer stack comprising a first semiconductor layer of a first conductivity type and a second semiconductor layer of a second conductivity type;
forming an electrically conductive first contact layer in direct contact with the first semiconductor layer, a maximum lateral extension of the second semiconductor layer being greater than the maximum lateral extension of the first semiconductor layer, to form a workpiece comprising a step structure;
conformally forming a first insulating layer over the step structure of the first and the second semiconductor layers and in direct contact with each of the first and second semiconductor layers;

forming a second insulating layer over a horizontal surface of the first contact layer and directly adjacent to the horizontal surface of the first contact layer, a layer thickness of the second insulating layer being smaller than the smallest layer thickness of the first insulating layer over the step structure; and forming a second current spreading structure over the second insulating layer and directly adjacent to the second insulating layer, the second current spreading structure being electrically connected to the second semiconductor layer.

18. The method according to claim 17, further comprising forming a first current spreading layer after forming the contact layer.

19. The method according to claim 15, further comprising forming a sacrificial metal layer before forming the first insulating layer.

20. The method according to claim 17, further comprising forming a passivation layer before forming the first insulating layer.

21. The method according to claim 17, wherein the first insulating layer is formed over horizontal regions of the first contact layer, and the method further comprises subsequently removing the first insulating layer from horizontal regions of the workpiece before applying the second insulating layer.

22. The method according to claim 17, wherein the second insulating layer is formed directly adjacent to the entire horizontal surface of the first contact layer.

* * * * *